United States Patent
Dichenko

(10) Patent No.: US 11,736,671 B2
(45) Date of Patent: Aug. 22, 2023

(54) DETERMINING A TONING COEFFICIENT FOR VIDEO, IMAGE AND AUDIO FILES

(71) Applicants: Mikhail Dichenko, Saint-Petersburg (RU); Irina Tulaeva, Saint-Petersburg (RU)

(72) Inventor: Mikhail Dichenko, Saint-Petersburg (RU)

(*) Notice: Subject to any disclaimer, the term of this patent is extended or adjusted under 35 U.S.C. 154(b) by 312 days.

(21) Appl. No.: 16/890,066

(22) Filed: Jun. 2, 2020

(65) Prior Publication Data

US 2021/0377503 A1    Dec. 2, 2021

(51) Int. Cl.
| | | |
|---|---|---|
| *H04N 9/68* | (2023.01) | |
| *H04N 9/64* | (2023.01) | |
| *G06T 7/00* | (2017.01) | |
| *H03G 5/00* | (2006.01) | |
| *H04N 1/407* | (2006.01) | |
| *H04N 23/88* | (2023.01) | |

(52) U.S. Cl.
CPC ............... *H04N 9/68* (2013.01); *G06T 7/00* (2013.01); *H03G 5/00* (2013.01); *H03G 5/005* (2013.01); *H04N 1/4072* (2013.01); *H04N 9/643* (2013.01); *H04N 9/646* (2013.01); *H04N 23/88* (2023.01)

(58) Field of Classification Search
CPC ........ H03G 5/00; H03G 5/005; H04N 1/4072; H04N 9/68; H04N 9/643; H04N 9/646; H04N 9/735; H04N 1/60; G06T 11/00; G06T 7/00; G10L 21/0316
See application file for complete search history.

(56) References Cited

U.S. PATENT DOCUMENTS

| | | | | |
|---|---|---|---|---|
| 6,278,655 | B2* | 8/2001 | Lancaster | G01V 3/06 379/14.01 |
| 8,260,118 | B2* | 9/2012 | Okada | H04N 5/76 386/242 |
| 9,816,988 | B1* | 11/2017 | Paik | G01N 33/5438 |
| 10,817,980 | B2* | 10/2020 | Shimizu | H04R 1/326 |
| 2006/0114350 | A1* | 6/2006 | Shimada | H04N 21/4312 375/E7.198 |
| 2007/0147510 | A1* | 6/2007 | Asad | H04N 19/186 375/240.18 |
| 2014/0032538 | A1* | 1/2014 | Arngren | G06F 16/2228 707/723 |
| 2017/0162195 | A1* | 6/2017 | Umesawa | G10L 15/22 |

FOREIGN PATENT DOCUMENTS

| | | | | |
|---|---|---|---|---|
| WO | WO-2018168902 A1 * | 3/2018 | | H04R 1/406 |
| WO | WO-2018168902 A1 * | 9/2018 | | H04R 1/406 |

* cited by examiner

*Primary Examiner* — Philip P. Dang
(74) *Attorney, Agent, or Firm* — ArentFox Schiff LLP; Michael Fainberg

(57) ABSTRACT

A method for changing an image file based on a toning coefficient includes receiving an image file including an image having a plurality of pixels. Toning characteristic function is determined for each pixel of the received image. Distribution of the plurality of pixels of the received image is analyzed using the toning characteristic function. The toning coefficient of the received image is determined based on the analyzed distribution of the plurality of pixels. A degree of toning of the received image file is changed using a user specified criteria based on the determined toning coefficient.

12 Claims, 10 Drawing Sheets

DETERMINING A TONING COEFFICIENT FOR VIDEO, IMAGE AND AUDIO FILES

TECHNICAL FIELD

The present invention relates to image and sound processing techniques, and more specifically, to a method and apparatus for determining a toning coefficient for image, audio and video files.

BACKGROUND

Since the advent of the television, video advertising has become widespread to the point of becoming an almost ubiquitous way to communicate with consumers and influence consumer behavior. The importance of video advertising has continued and grown considerably with the growth of alternative platforms for consuming video content available through wide area networks, such as the Internet. and broadband wireless communications networks. Alternative platforms may include, for example, online video streaming sites and online video downloading sites. Such platforms may provide greater convenience, choice, and flexible scheduling of video content without requiring the use of additional appliances such as digital video recorders by the consumer. Both traditional and alternative platforms for video content are commonly funded, at least in part, by selling video advertising to various advertisers.

The production of video advertising may be relatively time-consuming and expensive compared to other advertising forms In addition, effective distribution and targeting of video advertising may add considerable costs to an advertising budget. Advertisers naturally want to obtain the best possible results for the considerable investment in video advertising campaigns, and the development of effective video advertising is of great and increasing importance to advertisers. At the same time, factors such as increasing diversity and competition, cultural changes, faster advertising cycles, and technological innovation may make it difficult to predict the effectiveness of a particular video advertisement or campaign. Therefore, some video advertising or campaigns may not be as effective as possible for a given advertised product or service.

SUMMARY

In one aspect, a method for changing an image file based on a toning coefficient includes receiving an image file including an image having a plurality of pixels. Toning characteristic function is determined for each pixel of the received image. Distribution of the plurality of pixels of the received image is analyzed using the toning characteristic function. The toning coefficient of the received image is determined based on the analyzed distribution of the plurality of pixels. A degree of toning of the received image file is changed using a user specified criteria based on the determined toning coefficient.

A method for determining a toning coefficient of a sound file includes receiving a sound file having a plurality of samples. Distribution of the plurality of samples of the received sound file is analyzed using sound characteristic functions. The toning coefficient of the received sound file is determined based on the analyzed distribution of the plurality of samples.

BRIEF DESCRIPTION OF THE DRAWINGS

The accompanying drawings, which are incorporated into and constitute a part of this specification, illustrate one or more example embodiments of the present disclosure and, together with the detailed description, serve to explain their principles and implementations.

DETAILED DESCRIPTION

Figure 1:
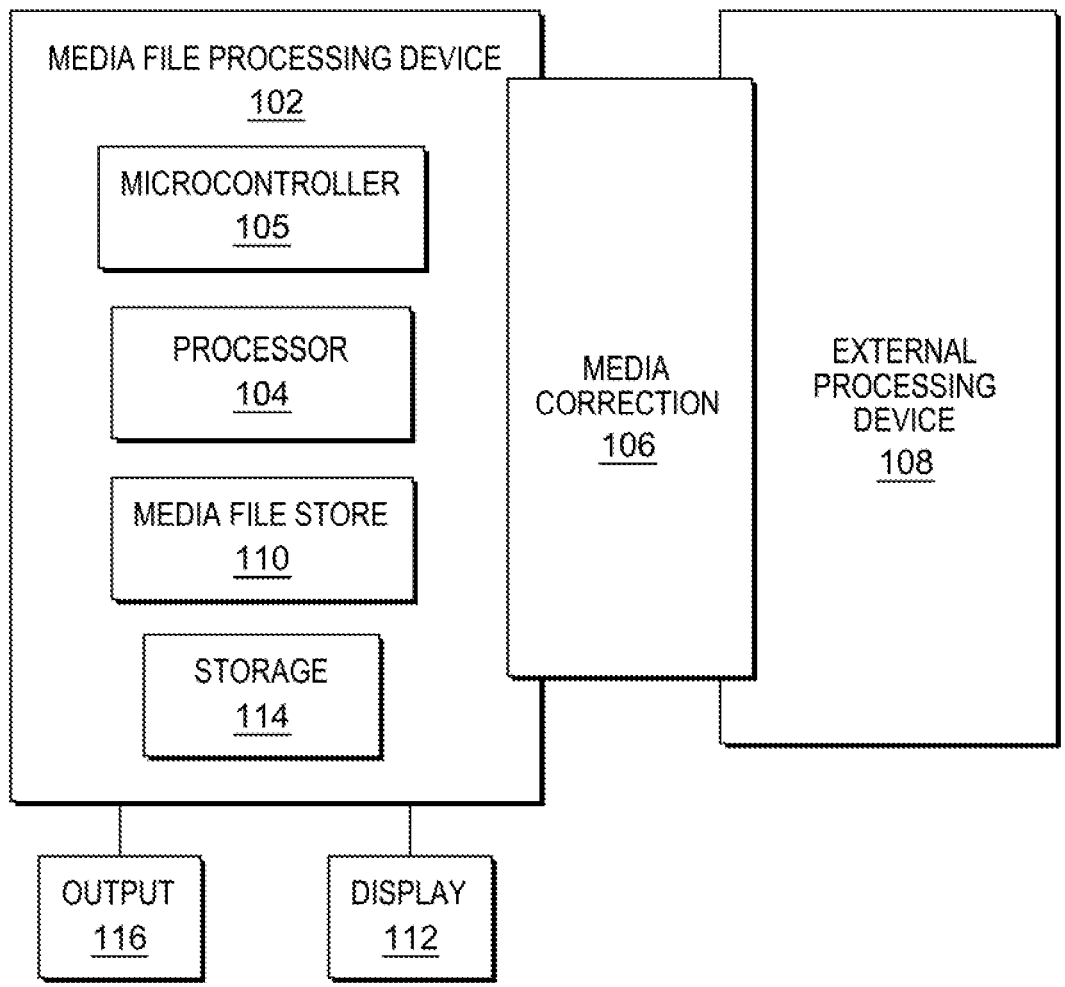
FIG. 1 is a block diagram of an image processing apparatus operating in accordance with an embodiment of the present invention.

Image capture devices typically work in RGB color space, and each sensor will have its own color response characteristics. The CIELAB model (also known as simply LAB) also defines a color space in terms of three components: L (lightness from black to white), A (from green to red) and B (from blue to yellow).

Embodiments of the present invention are directed to a novel techniques of image and audio analysis that determine a toning coefficient. Embodiments of the present invention are further directed to image, sound and video improvement techniques based on the determined toning coefficient.

There are two generally accepted types of human perception of colors: warm colors and cold colors. These groups of colors have the opposite effect on the human nervous system. Warm colors excite the human nervous system, while cold colors soothe it, due to their different physical nature. Colors are electromagnetic waves reflected from the carrier. In one embodiment of the present invention, another media file characteristic—T (Toning) may be used for determining optimality of the media file, as disclosed herein.

Generally, the waves have at least two characteristics—a wavelength and a frequency. The group of warm colors has on average a wavelength of 622 nm. The group of cold colors has on average a wavelength of 474 nm. The difference between wavelengths is approximately 31% The wavelength of the color red is 1.67 times greater than the wavelength of the color violet. Such a difference can be established as sufficiently perceivable and explains the different effect on a person.

With respect to audio files, the tempo of the music a person is listening to can vary more widely than the difference in wavelengths of colors. For example, the very slow tempo has a value of 40 on the Malter metronome. A metronome serves as an accurate measure of tempo. The fastest tempo has a value above 200, which is about five times greater than the slowest one. Faster music generally stimulates the nervous system, and slow music generally calms a person's state of mind.

Embodiments of the present invention introduce a new characteristic of audio-visual information—toning. None of color models (RGB, HSV, LAB, CYMK) known in the art contain such a characteristic. Various embodiments of the present invention disclose techniques for determining toning coefficients indicating the degree of toning of various media files (such as photo, music and video files). In addition, embodiments of the present invention disclose techniques for changing an image and/or video files that make it possible to transform an image in its degree of toning independently of the toning measurement.

Information about the toning coefficient of a video, photo or sound file enables users to compare several variants of the file and choose the one most appropriate for the specific purpose.

As an example of the video selection process, a promotional video stimulating action may be chosen based on the highest toning coefficient. A relaxing video at the end of the day may be chosen from the video files having a low toning coefficient.

Similarly, with respect to music selection process, in the morning of and/or on the eve of important meetings, presentations, examinations, and the like, the musical compositions having a high toning coefficient that activate cognitive processes and tone the nervous system will be chosen. Before sleep, musical compositions with a low toning coefficient may be chosen.

FIG. 1 is a block diagram of a media file processing device 102 operating in accordance with an embodiment of the present invention. It will be appreciated that many of the processes implemented in the media file processing device 102 are implemented in or controlled by software operating on a microprocessor, central processing unit, controller, digital signal processor and/or an application specific integrated circuit, collectively depicted as processor 104. All user interface and control of peripheral components such as buttons and display is controlled by a microcontroller 105.

In operation, the processor 104, in response to receiving one or more media files, initiates and controls the file analyzing process. A characteristic function for analyzing the received file is determined, for example, based on a user input. The one or more files analyzed by the media file processing device 102 may be stored in a media file store 110 which may comprise computer memory such a dynamic random-access memory or a non-volatile memory. The file processing device 102 may be equipped with a display 112, such as an LCD, both for displaying analyzed images and displaying a user interface for control software of the media file processing device 102.

According to an embodiment, the media processing device 102 further comprises a media correction module 106. The media correction module 106 may be arranged for off-line correction of analyzed files in an external processing device 108, such as a desktop computer, a color printer or a photo kiosk In this embodiment, the processor 104 receives the media file (e.g., captured high resolution digital image) from the media file store 110 and analyzes it to determine a toning coefficient of the file. The analysis is performed as described in the embodiments to follow. If, for example, image toning optimization is requested, the media correction module 106 can modify the image based on the determined coefficient of toning. The modified image may be either displayed on image display 112, saved on a persistent storage 114 which can be internal or a removable storage such as CF card, SD card or the like, or downloaded to another device via output means 116 which can be tethered or wireless. The media correction module 106 can be brought into operation either automatically or manually each time a media file is processed. Although illustrated as a separate item, where the media correction module 106 is part of the media file processing device 102, it may be implemented by suitable software on the processor 104. It should be noted that the scope of the invention is not intended to be limited to any particular implementation using technology either now known or later developed in the future.

Figure 2:
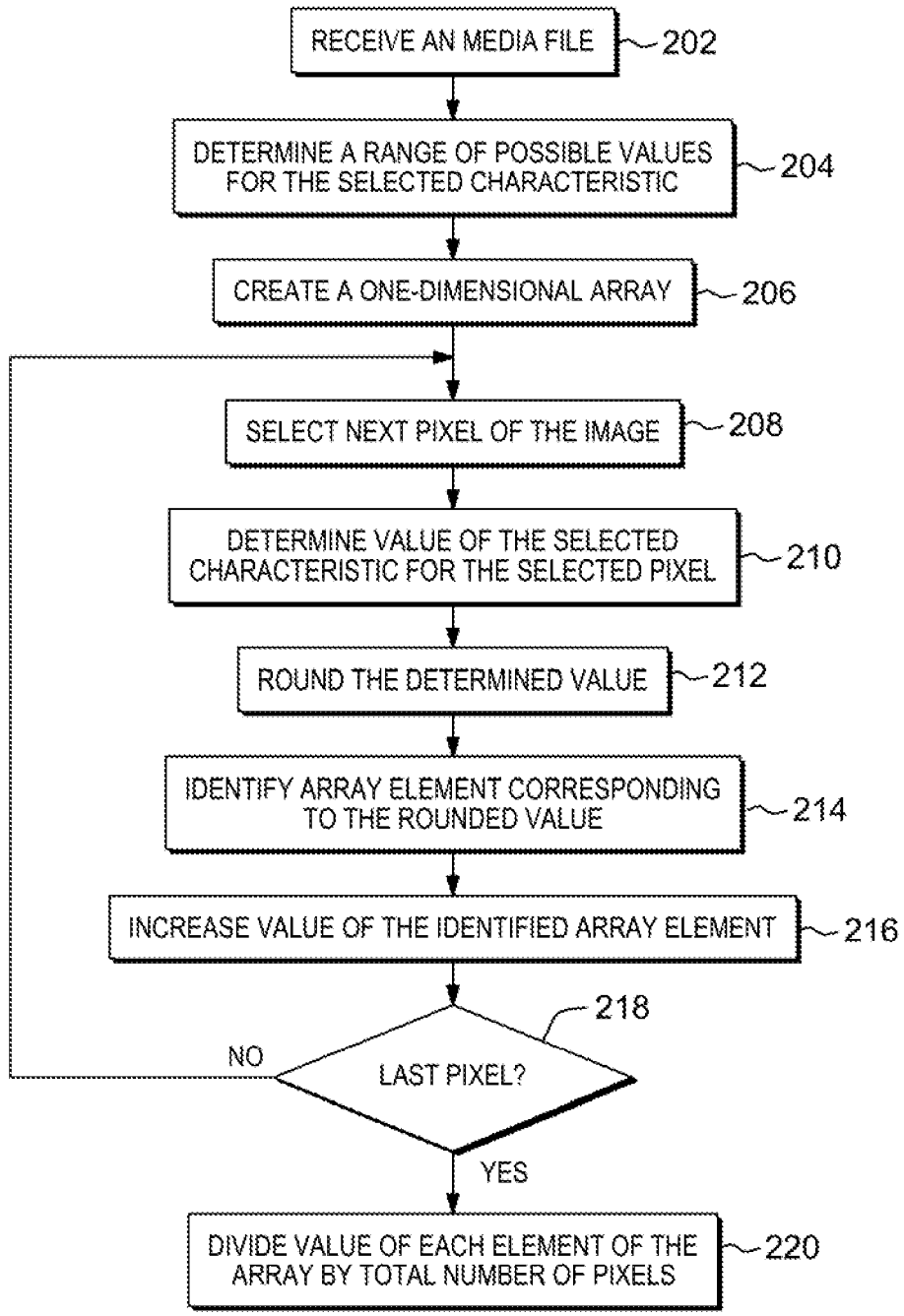
FIG. 2 is a flowchart of a method for analyzing a received image based on a toning characteristic, in accordance with embodiments of the present invention.

FIG. 2 is a flowchart of a method for analyzing a received media file based on a toning characteristic, in accordance with embodiments of the present invention. In block 202, the processor 104 receives a media file to be analyzed. In one embodiment, the processor 104 may receive a digital image from the media file store 110. The received image includes a plurality of pixels. Each pixel included in the analyzed image has a variety of characteristics associated therewith.

The characteristics of the received image (e.g., brightness, lightness, hue, saturation, intensity of red light, intensity of blue light, intensity of green light, etc.) based on the corresponding image coding model, such as, but not limited to, RGB, Cyan, Magenta, Yellow, and Black (CMYK), HSV, XYZ, CIELAB, and the like. According to an embodiment of the present invention, the disclosed image analysis process consists of the evaluation of all the pixels included in the received image. The analysis is performed based on a tonic characteristic.

In block 204, the processor 104 determines a range of possible values for the toning characteristic. For example, the range of possible values may be the set [0; 100].

To calculate the distribution of the analyzed image pixels using the toning characteristic, the processor 104 constructs a one-dimensional array (block 206). Elements of the constructed one-dimensional array correspond to discrete values of the toning characteristic—from its minimum possible value ($x_{min}$) to the maximum possible value ($x_{max}$) with an equal interval ("step"), hereinafter denoted by dx. Length of the array constructed in block 206 (the number of elements in the array) is denoted by the letter N hereinafter. The array itself is denoted by the letter P, and the value of array's individual element is denoted by p(i), where i is the ordinal number of the element of the array P. The value of the toning characteristic X, which corresponds to the i-th element of the array P, is denoted as x (i). To determine the density of the distribution using, for example, the characteristic L, an array of 101 elements is created. The 1st element of the created array corresponds to the value L=0, the 2nd element corresponds to the value L=1, and so on with step=1. It is noted that before the start of the described herein image analysis, all elements of the created array are initialized to 0.

According to an embodiment of the present invention, in block 208, the processor 104 selects next pixel of the image to be analyzed. Next, in block 210, for the selected pixel of the image (denoted below as pix), the value of the toning characteristic (denoted as x (pix)) is calculated by the processor 104. In block 212, the processor 104 rounds the determined value. This rounded value, using rounding to a multiple of the "step," corresponds to one of the discrete values defined for each of the elements of the constructed array. Continuing with the exemplary characteristic L, for the selected pixel of the received image, the value of the characteristic L is calculated. Next, the calculated value is rounded to a multiple of the "step". When rounding, the processor 104 performs the calculation to the nearest discrete value (in the example with the characteristic L—to the nearest integer value), and a number located at the same distance from two adjacent discrete values is rounded off to the smallest value. For example, if the calculated value of the characteristic L of the analyzed pixel is 44.5—the processor 104 rounds it to 44. Consequently, the value of the 45th element of the array will be increased by 1, since the array for the exemplary characteristic L is constructed so that the counting starts from 0 with step 1 and the value L=44 falls on the 45th element of the array.

According to an embodiment of the present invention, in block 214, the processor 104 identifies the array element corresponding to the rounded value. In block 216, the processor 104 increases the value of the identified array element. More specifically, the processor 104 increases by 1 the value of the array element having an index equal to the rounded characteristic value of the analyzed pixel.

In step 218, the processor 104 determines whether the analyzed pixel comprises the last pixel of the image. In response to determining that the analyzed pixel is not the last pixel (decision block 218, "No" branch), the processor 104 repeats blocks 208-216 for all remaining pixels of the received image I. As a result, after processing all the pixels of the received image I (hereinafter, the total number of pixels is denoted by the letter Q), the sum of the values of all of the array elements is equal to the number of pixels of the received image I. An element of the array denotes the number of pixels with a given value of the characteristic, divided by the total number of pixels. The concluding step of the image analyzing procedure for the toning characteristic comprises the normalization of the values of the elements of the constructed array in order to bring it to the classical form, where the total distribution of the analyzed image pixels is equal to 1.

According to an embodiment of the present invention, in response to determining that the last pixel of the analyzed image was processed (block 218, "Yes" branch), in block 220, the processor 104 divides the value of each element of the array by the total number of pixels in the analyzed image. It should be noted, the sum of the values of all the elements of the array are equal to 1.

Figure 3:
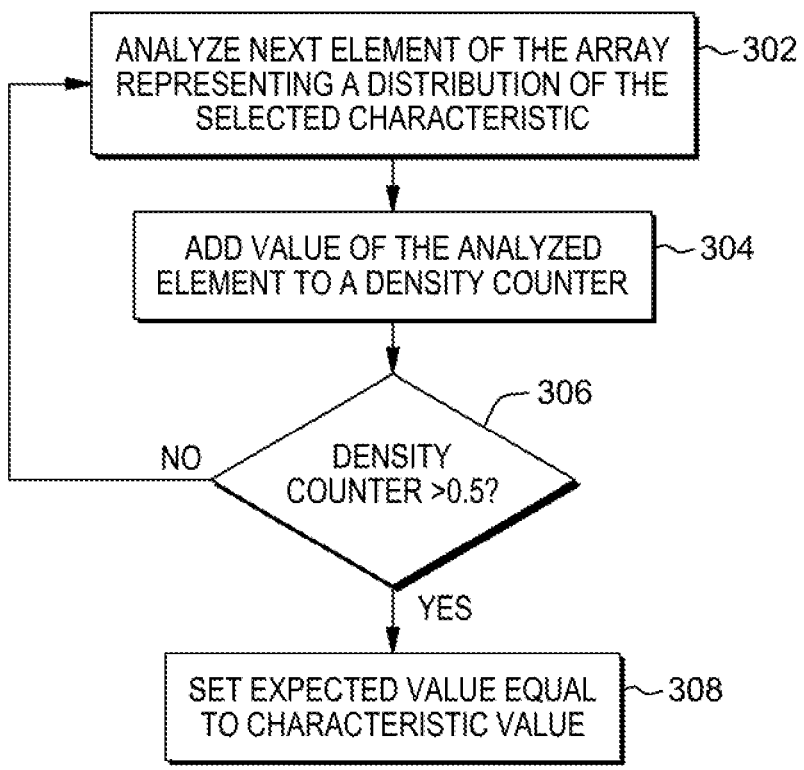
FIG. 3 is a flowchart of a method for analyzing distribution of the plurality of pixels of the received image using the toning characteristic function, in accordance with embodiments of the present invention.

FIG. 3 is a flowchart of a method for analyzing distribution of the plurality of pixels of the received image using the toning characteristic function. The second stage of the analysis comprises the comparison of the distribution of the toning characteristic X obtained at the first stage (shown in FIG. 2) with the normal distribution, which is described by the formula (1) of the Gaussian function:

$$f(x) = \frac{1}{\sigma\sqrt{2\pi}} - e^{-\frac{(x-\mu)^2}{2\sigma^2}} \quad (1)$$

where the parameter p is the mathematical expectation (average value), median and mode of the distribution, and the parameter σ is the mean-square deviation or sigma (σ² is the dispersion) of the distribution. The square root of the dispersion is the sigma. The result of comparing the two distributions, as discussed below, enables the processor 104 to perform a quantitative assessment of the optimality of the analyzed image based on the toning characteristic X. It should be noted that in order to reliably compare both density distributions, the compared distributions first need to be reduced to a single scale and coordinate system. According to an embodiment of the present invention, this conformity is achieved by using the expected value and variance of the distribution of the toning characteristic as parameters μ and σ² of the Gaussian function, respectively. The expected value of the distribution of the toning characteristic, considering the discretization used at the first stage, is calculated not with absolute accuracy, but with some approximation, as discussed below.

In block 302, the processor 104 initializes variables utilized for calculation of the expected value. In one embodiment, the processor 104 initializes variables i and S to 0, where the variable i comprises a counter of the index of the current element of the array representing the distribution of the toning characteristic and the variable S comprises the counter of the total density of the analyzed array elements. In addition, in block 302, the processor 104 analyzes the next element of the array representing the distribution of the toning characteristic, where i is the index of the analyzed element of the array.

According to an embodiment of the present invention, in block 304, the processor 104 adds the value of the analyzed element of the array to the counter of total density S (S=p(i)). In block 306, the processor 104 determines if the total density counter is greater than 0.5 (s>0.5). In response to determining that the total density counter does not exceed 0.5 (decision block 306, "No" branch), the processor 104 returns to block 302 and repeats it along with the block 304. In response to determining that the total density counter does exceed 0.5 (decision block 306, "Yes" branch), in block 308, the processor 104 sets the expected value to the value of the toning characteristic corresponding to the analyzed element (μ=X(i)).

The variance of the distribution density array of the toning characteristic is calculated by the following formula (2):

$$D = \sqrt{\sum_{i=1}^{n} \frac{1}{n}(p(i) - \overline{p})^2} \quad (2)$$

where D is the dispersion; p(i) is the value of the density at the i-th element of the density array; $\overline{p}$ is the average arithmetic value of an array element; and where $$\overline{p} = \frac{\sum_{i=1}^{n} p(i)}{n};$$

n is the number of elements in the array.

As a result, after the calculation of the dispersion the sigma of the actual distribution (the square root of the disper) also becomes-known.

Figure 4:
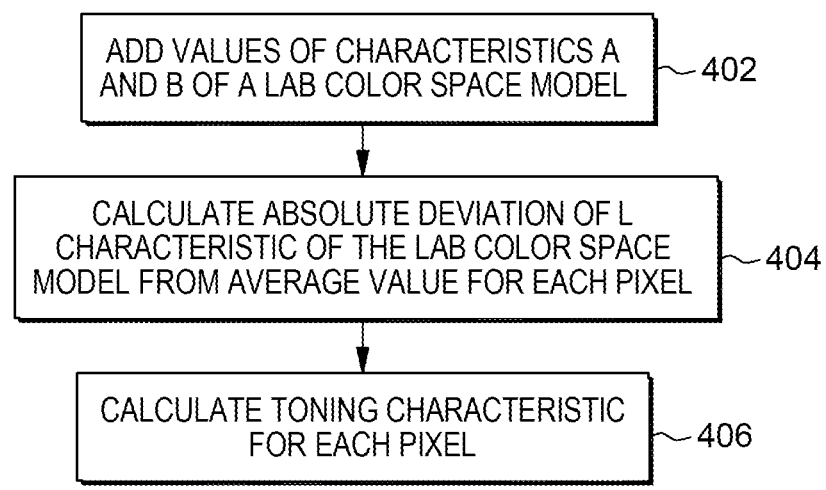
FIG. 4 is a flowchart of a method determining a toning coefficient for an image using a LAB color space model, in accordance with an embodiment of the present invention.

FIG. 4 is a flowchart of a method determining a toning coefficient for an image using a LAB color space model, in accordance with an embodiment of the present invention. The characteristics A and B have values in the form of negative deviations from 0 in the respective directions. At step 402, the processor 104 adds the values of characteristics A and B for each pixel. At the next step, the processor 104 determines the influence of the lightness on the toning coefficient. More specifically, at 404, the processor 104 performs a calculation of the absolute deviation of the value of each pixel with respect to a characteristic L from the average value, which can be denoted as deltaL. In one embodiment, the processor 104 may find deltaL for each pixel using the following formula (3):

$$\text{delta}L = 50 - |L| \tag{3}$$

In other words, DeltaL takes only a positive integer values from 0 to 50.

At step 406, the processor 104 calculates toning characteristic T for each pixel using the following formula (4):

$$T = A + B(+ \text{ or } -)Cor1 * \text{delta}L \tag{4},$$

where Cor1 is the coefficient of correction.

It should be noted that in the formula (4) above the selection of the operator (plus or minus) in front of the expression (Cor1*deltaL) depends on the result of the sum (A+B). More specifically, when (A+B) is greater than 0 the processor 104 uses the minus operator and when (A+B) is less than 0 the processor 104 uses the plus operator. If (A+B)=0 then the value of Cor1 is equal to 0.

The difference from zero of the sum A+B can be denoted as deltaAB, and takes only positive values |(A+B)–0|. The difference between the sum A+B and zero is taken in modulus and rounded to a whole number. With the value deltaAB=1 the value Cor1=0.005263.

for deltaAB=2: Cor1=2*0.005263;
for deltaAB=3: Cor1=3*0.005263;
and so on . . . .

The value of T is rounded to a whole number by the processor 104 and can take negative, positive and zero values.

Figure 5:
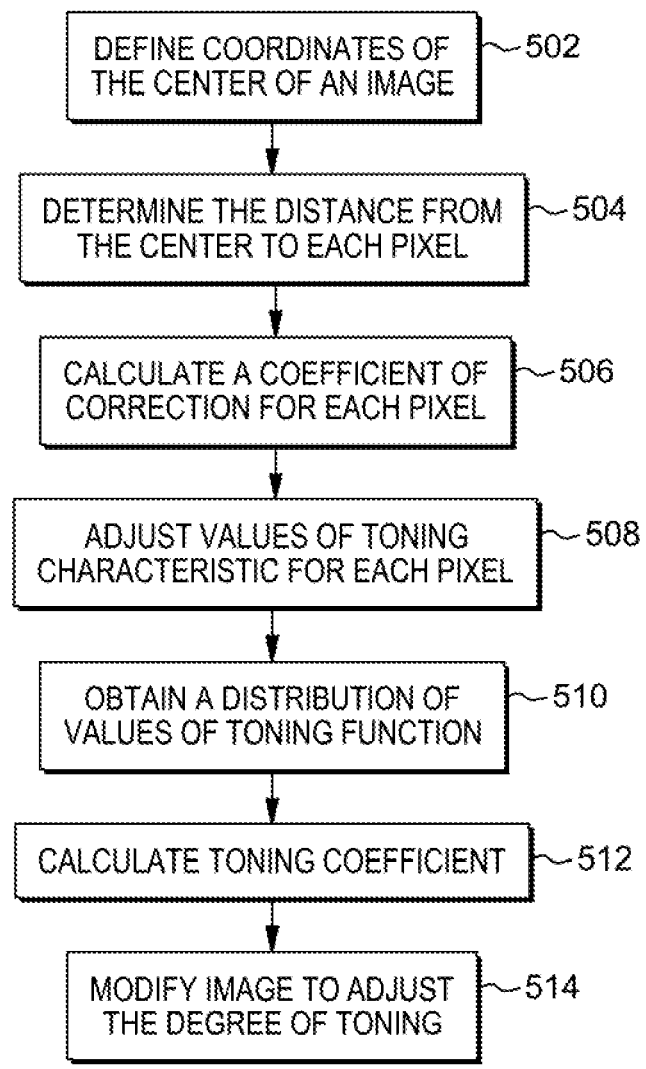
FIG. 5 is a flowchart of a method of correcting the toning coefficient for peripherally of the image, in accordance with an embodiment of the present invention.

FIG. 5 is a flowchart of a method of correcting the toning coefficient for peripherality of the image, in accordance with an embodiment of the present invention. Generally, when looking at an image, a person does not pay attention equally to all parts of the image. The method of correction of an image with allowance for peripherality is based on the observation that a person typically focuses on one part of the image and their attention is reduced on the periphery. In one embodiment, the processor 104 performs the method of correcting the values of toning characteristic under the assumption that all the images to be analyzed have a rectangular shape. At step 502, the processor 104 defines coordinates of the center of the image. The centre of the image is defined at the intersection of the central axis along the length and the central axis along the width of the image. The centre of the image has coordinates.

At step 504, the processor 104 determines the distance from each pixel to the center of the image In one embodiment, the processor 104 determines the distance from the center of the image to the center of each pixel. These segments can take values from 0 to Le-max (the maximum length of a segment, i.e., the maximum distance from the centre to the furthest pixel). This range of pixel distances is denoted herein as Dle.

At step 506, the processor 104 calculates the coefficient of correction for each pixel using an S-function. The number of steps of the correction coefficient is constant and is equal to 100. In all there are 101 coefficients. The values of 99 coefficients are determined by a nonlinear S-curve function as described below, where the lower limit of the function is Kpmin (i.e., minimum coefficient) and the upper limit is 1.

In one embodiment, the processor 104 divides the range of pixel distances Dle into one hundred and one groups. Next, the processor 104 defines boundaries of the groups and distributes all pixels over the groups in accordance with the magnitude of the distance of a corresponding pixel from the center. It should be noted that within the defined one hundred and one groups, the first group of pixels is the closest to the center, and the hundred and first group of pixels is the furthest from the center. The last group is denoted herein as DleMax.

Further, at step 508, the processor 104 adjusts the value of the toning characteristic for the pixels of each group. For example, for the pixels in the one hundred and first group the previously determined value of the toning characteristic is multiplied by the coefficient Kpmin. For the pixels of the group (DleMax–1), the processor 104 changes the value of the toning characteristic by multiplying its actual value by the coefficient for the next group of pixels Kp(min+1). The value of Kpmin may vary depending on the desirable degree of toning. For example, Kpmin may be set to 0.3 or 0.5. In these cases, the values of 101 coefficients range between 0.3 and 1 and between 0.5 and 1, respectively. The coefficients may be determined using a nonlinear S-curve function. This way the processor 104 changes the values of the toning characteristic of all groups of pixels.

The nonlinear S function that is applied by the processor 104 in the calculation of the correction coefficients is described in the general case by the following formula (5)

$$y = \frac{k}{1 + b * e^{-ax}}, \tag{5}$$

Figure 6:
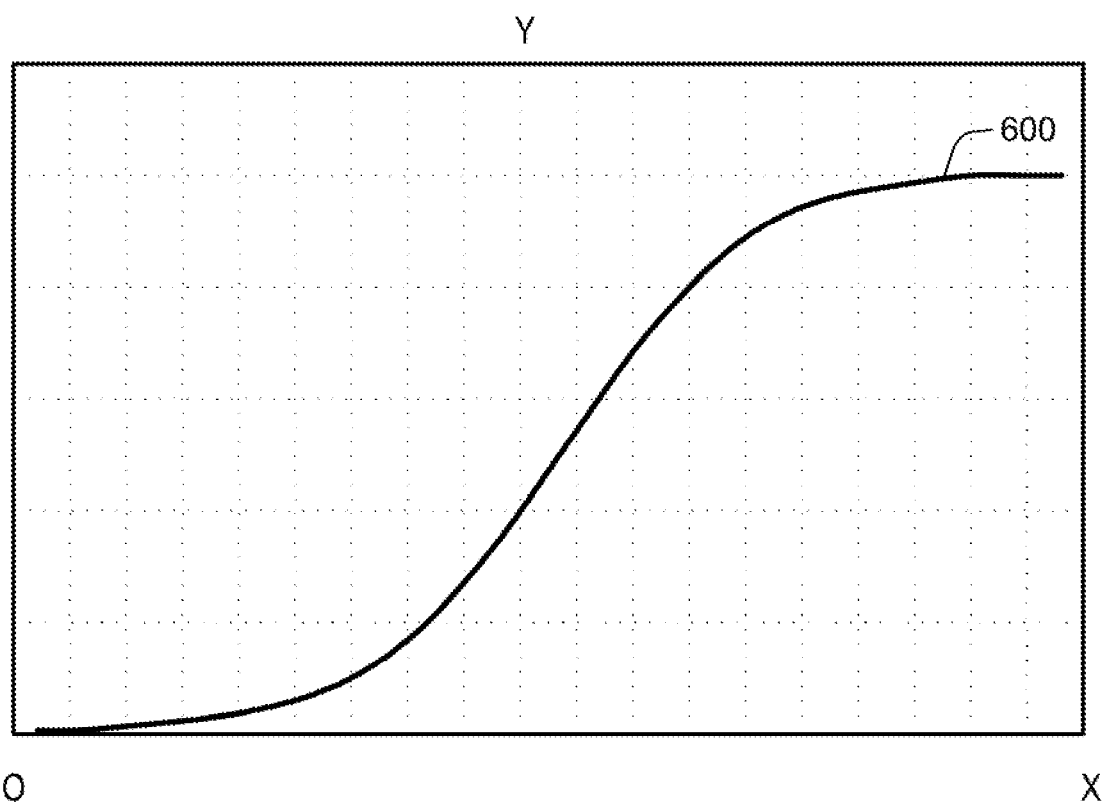
FIG. 6 illustrates the graph of the general form of the S function used for calculation of a coefficient of correction, in accordance with an embodiment of the present invention.

The graph of the general form of S function 600 is illustrated in FIG. 6. However, to apply this function to the calculation of the coefficients over 100 equal intervals (100 steps) in such a way that the coefficient for step 1 tends to 1 and the coefficient for step 100 tends to 0 the processor 104 may use the "inverse" S function, calculated by the formula (6).

$$y = 1 - \frac{k}{1 + b * e^{-ax}} \tag{6}$$

where k=1, b=735.0952 and a=0.12. It should be noted that these specific coefficients (k=1, b=735.0952 and a=0.12) are valid in the case when Kpmin=0. However, the value of Kpmin may range from about 0.01 to about 0.99, and the values of K, a and b may vary and may correspond to a particular value of KPmin. In other words, the final form of the S function used by the processor 104 to calculate the correction coefficients is described by the formula (7):

$$y = 1 - \frac{1}{1 + 735.0952 * e^{-0.12x}} \tag{7}$$

Figure 7:
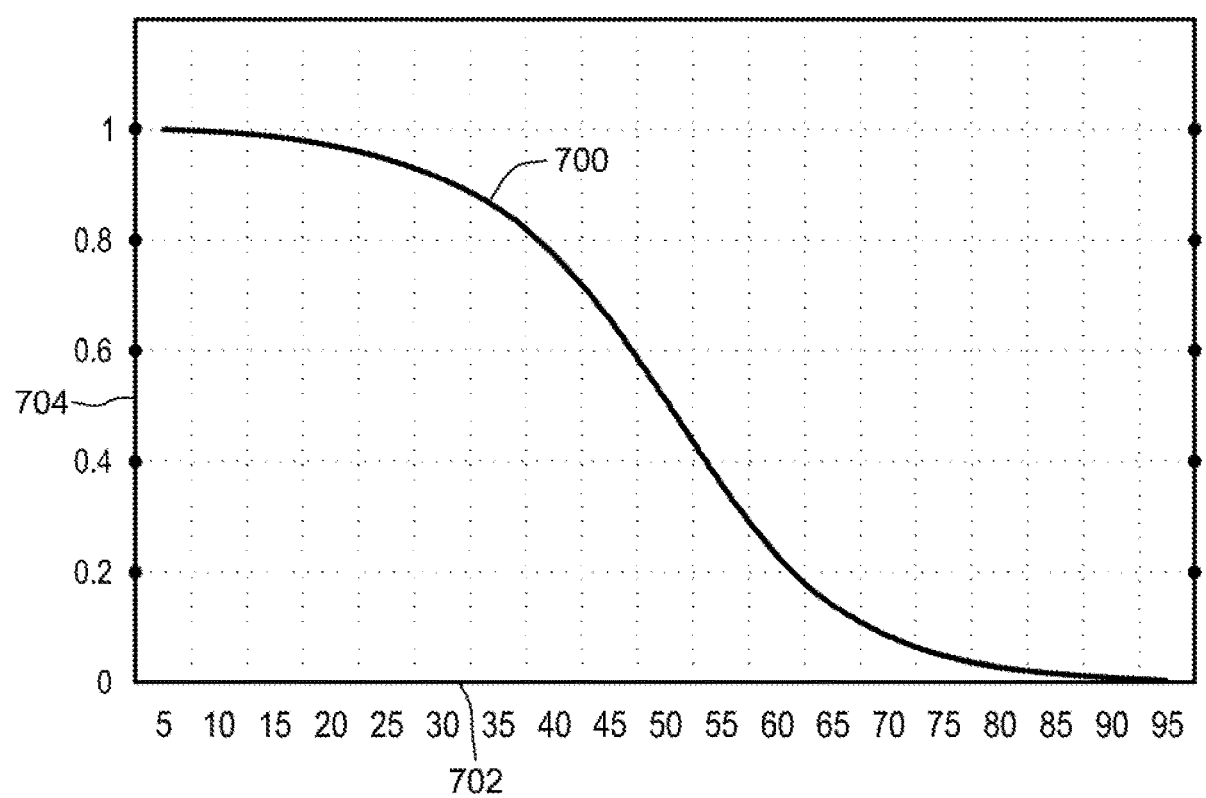
FIG. 7 illustrates the graph of the inverse S function.

The graph of the inverse S function 700 described by formula (7) is illustrated in FIG. In FIG. 7, the values along the Y axis 704 are those coefficients by which the value of the i-th step on the segment from Kpmin to 1 is multiplied.

After the processor 104 determines first set values of the 101 elements of the generated array of correction coefficients, where the value of the first element is equal to 1 and the value of the 101st element is equal to Kpmin, with the same interval KpInt=(1–Kpmin)/100 between the values, each of the values is recalculated using the following formula (8):

$$Kp(i) = (y(i)*100*KpInt) + Kpmin, \tag{8}$$

where y(i) is the value of the function defined by the formula (7) above for x=i, and i is the sequence number of the correction coefficient, starting from 1.

The resulting graph 700, showing the distribution of the correction coefficients for Kpmin=0 and Kpmax=1, is shown in FIG. 7. The X axis 702 denotes the sequence number of elements of the array of correction coefficients, and the Y axis 704 denotes the final values of the correction coefficients for these elements. As a result, referring back at FIG. 5, at step 510, the processor 104 obtains a distribution of values of the toning function that takes into account correction for peripherality.

According to an embodiment of the present invention, at step 512, the processor 104 calculates the toning coefficient of the received image. As described above, the processor 104 distributes all pixels of the image, in respect to the toning characteristic T, in groups with a whole-number step of 1 in the respective positive and negative directions from zero.

The step 512 involves calculation of the mathematical expectation carried out by the processor 104 from the smallest value, either the most negative or the least positive. When the processor 104 processes half of the total number of pixels in the image, the resultant value is taken as the mathematical expectation (expected value) by the processor 104.

After determining the mathematical expectation, the processor 104 calculates the deviation of the distribution (the sigma). The toning coefficient is calculated by the processor 104 using the following formula (9) representing the sum of the mathematical expectation and the deviation of the distribution:

$$TNi = \mu + \sigma \quad (9)$$

At step 514, the media correction module 106 changes a media file based on a toning coefficient, in accordance with an embodiment of the present invention. It should be noted that the media correction module 104 may change the media file in accordance with one or more rules. According to a first rule, after the change of an image the deviation of the new distribution of the toning characteristic should be equal to the deviation of the actual distribution of the toning characteristic obtained before the change. According to a second rule, for each characteristic (e.g., A, B, deltaL) the media correction module 106 calculates the difference between the actual value of the corresponding characteristic and the limit value. Next, the media correction module 106 divides this difference into one hundred equal steps. All three of LAB characteristics of the pixel are changed by the same number of steps. According to a third rule, the degree of toning change is chosen by the user.

In one embodiment, the media correction module 106 may receive file changing criteria from a user. For example, a user may indicate whether the toning of the media file should be strengthened or weakened. The user may also indicate the degree of change. In one embodiment, the degree of change may be represented by a percentage value ranging from 0% to 100%, where 100% corresponds to the strongest change and 0% corresponds to the absence of change.

In an embodiment, the media correction module 106 changes all pixels of the image in proportion to all three characteristics of the LAB color model, in such a way that the toning of each pixel is changed in the direction selected by the user (either strengthened or weakened). The number of steps over which the change is made is chosen by the user and corresponds to a percentage value from 0% to 100%. When a percentage change other than 0% is chosen, the change in the values for a pixel is completed when the number of steps taken corresponds to the chosen percentage.

For example, when 50% is chosen, the media correction module 106 completes process of change of each pixel when 50 steps in respect of each characteristic have been traversed In the case when the actual value coincides with the limit value in respect of some characteristic, the process of change is implemented in respect of other characteristics of the pixel.

A video is a set of images ordered on the time scale. Therefore, change of a video in the direction of strengthening or weakening of the toning or in the direction of strengthening any color occurs by change of all the frames appearing in the video, in accordance with the algorithms described below.

Figure 8:
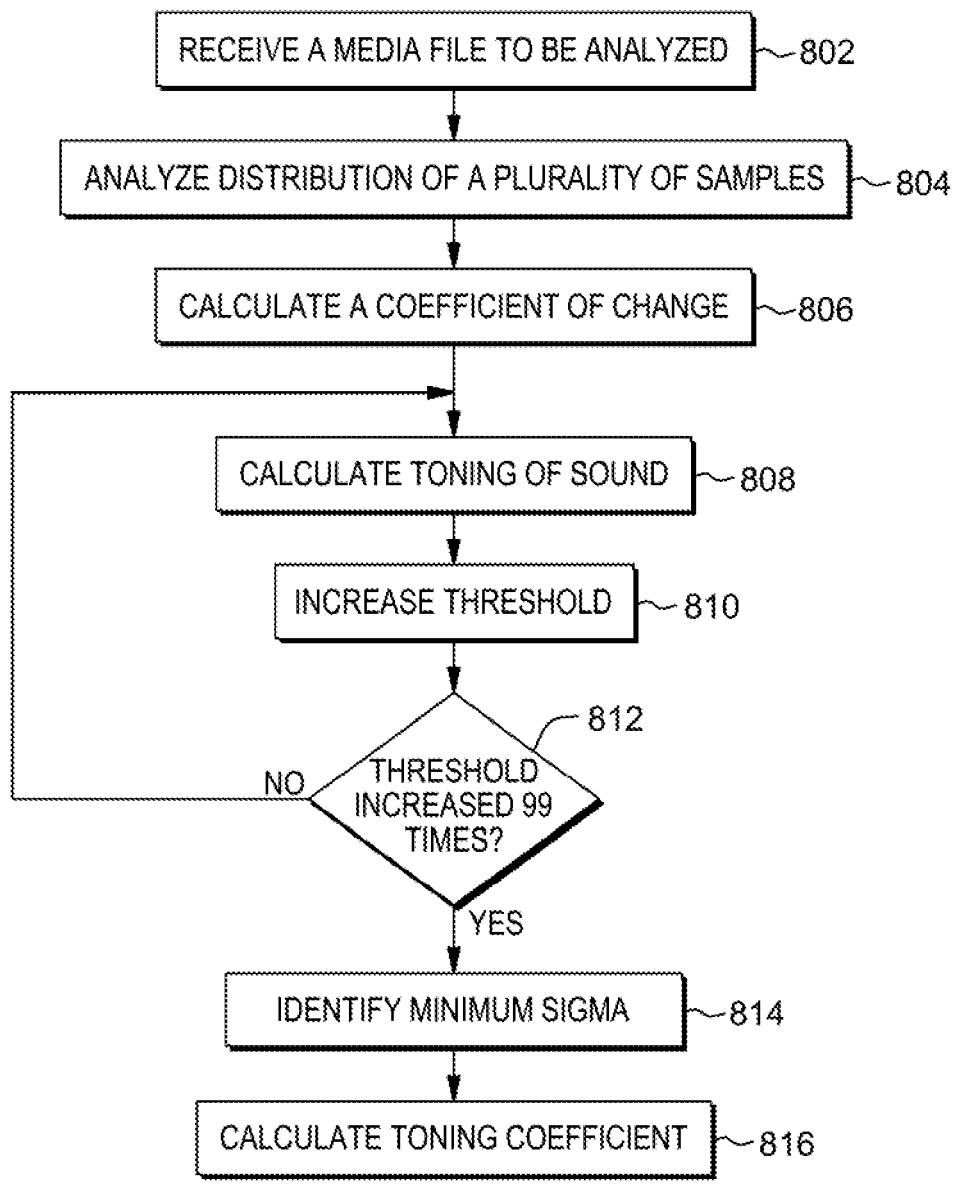
FIG. 8 is a flowchart of a method of determining a toning coefficient for an audio (sound) file, in accordance with an embodiment of the present invention.

FIG. 8 is a flowchart of a method of determining a toning coefficient for an audio (sound) file, in accordance with an embodiment of the present invention. At 802, the processor 104 receives a media file to be analyzed. In one embodiment, the processor 104 may receive a digital sound file from the media file store 110. The received sound includes a plurality of indivisible parts (samples) that have one or more characteristics.

In one embodiment, the processor 104 uses two characteristics—the frequency and amplitude of the sound. Generally, the frequency indicates the height of the tone, and the amplitude indicates the loudness of the sound.

At 804, the processor 104 analyzes distribution of a plurality of samples. All the samples are arranged on a time scale. The processor 104 divides the received digital file into equal time segments. In one embodiment, each segment represents a decisecond interval (one tenth of a second). At this step, the processor 104 also determines the number of deciseconds in the received digital file and assigns sequence numbers to each sample (e.g., sequence numbers from 1 to N are assigned to samples). For each sample, the processor 104 calculates the average value of the amplitude and compares amplitude values of adjacent samples. For example, the processor 104 divides the average value of the amplitude of the second sample by the average value of the amplitude for the first sample. This division is then done for all successive samples, including the last sample.

At 806, the processor 104 calculates a coefficient of change. For each sample, starting from the second, the processor 104 assigns a new value equal to the coefficient of change of the amplitude, which may be referred to as delta A, for example. The processor 104 excludes samples that have this coefficient below 1 from further analysis. The remaining samples form a first set of values of the coefficient of change, which are unambiguously correlated with one sample having a unique sequence number. The values of delta A represent the set by which it is possible to calculate (according to the above image toning algorithm) the expected value and sigma. At the next iteration of the analysis, the processor 104 excludes all delta A values equal and less than the calculated expected value. The remaining deltaA values (greater than the expected value) comprise a second set with the minimum and maximum values, the difference between which comprises a new interval. Next, the processor 104 divides this interval (second set) into 100 equal steps.

At 808, the processor 104 calculates toning of a sound (TNs) characteristic. More specifically, the processor 104 first analyzes the plurality of delta A values that are greater than the expected value (first cutoff threshold). In one embodiment, the processor 104 calculates the time scale differences in deciseconds between neighboring samples having adjacent sequence numbers. The calculated values represent a new characteristic the duration of a rhythm step.

This characteristic is denoted herein as TNs (toning of sound). In one embodiment, the processor 104 also calculates the expected value and sigma of the characteristic TNs for this set of delta A values.

At 810, the processor 104 increases the threshold (e.g., to a second threshold, third threshold, and so on).

At 812, the processor 104 determines if the threshold has been increased 99 times. In response to determining that the threshold has not been increased 99 times (decision block 812, "No" branch) the processor 104 returns to 808 to calculate the expected value and sigma for a second plurality of delta A values (greater than the increased threshold).

In response to determining that the threshold has been increased 99 times (decision block 812, yes branch), at 814, the processor 104 identifies the minimum sigma out of the ninety nine different sigmas calculated during the iterations described above. At 816, the processor 104 calculates the toning coefficient of the sound file. In one embodiment, the toning coefficient of the sound file is equal to the expected value associated with the minimum sigma calculated at 814. The toning coefficient of the sound file is expressed in deciseconds.

Advantageously, the processor 104 may use the toning coefficient measure to compare different audio files. A slower tempo determines a more relaxing effect, and a faster tempo will be evidence of a more tonizing effect of the music. Thus, a more relaxing file or a more tonizing file may be chosen, depending on the given desire of the user.

Figure 9:
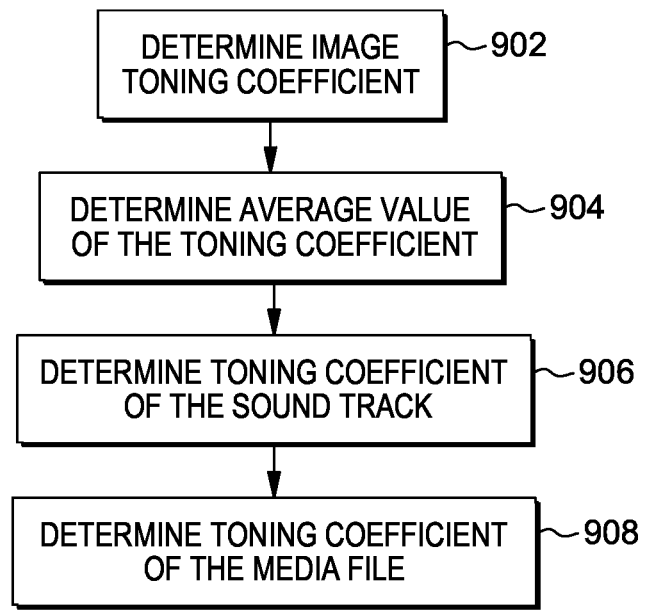
FIG. 9 is a flowchart of a method of determining a toning coefficient for a video sound file, in accordance with an embodiment of the present invention.

FIG. 9 is a flowchart of a method of determining a toning coefficient for a video sound file, in accordance with an embodiment of the present invention. The video sound file includes a plurality of frames. Each of the plurality of frames includes an image and a sound sample.

At 902, the processor 104 determines the image toning coefficient as described above in conjunction with FIG. 5.

At 904, the processor 104 determines the average value (avTNi) of the image toning coefficient.

At 906, the processor 104 determines the toning coefficient of the sound file (TNs) representing the sound track of the video sound file, as described above in conjunction with FIG. 8.

At 908, the processor 104 determines the toning coefficient of the video sound file (TNv) using the following formula (10).

$$TNv = avTNi/TNs \quad (10).$$

Figure 10:
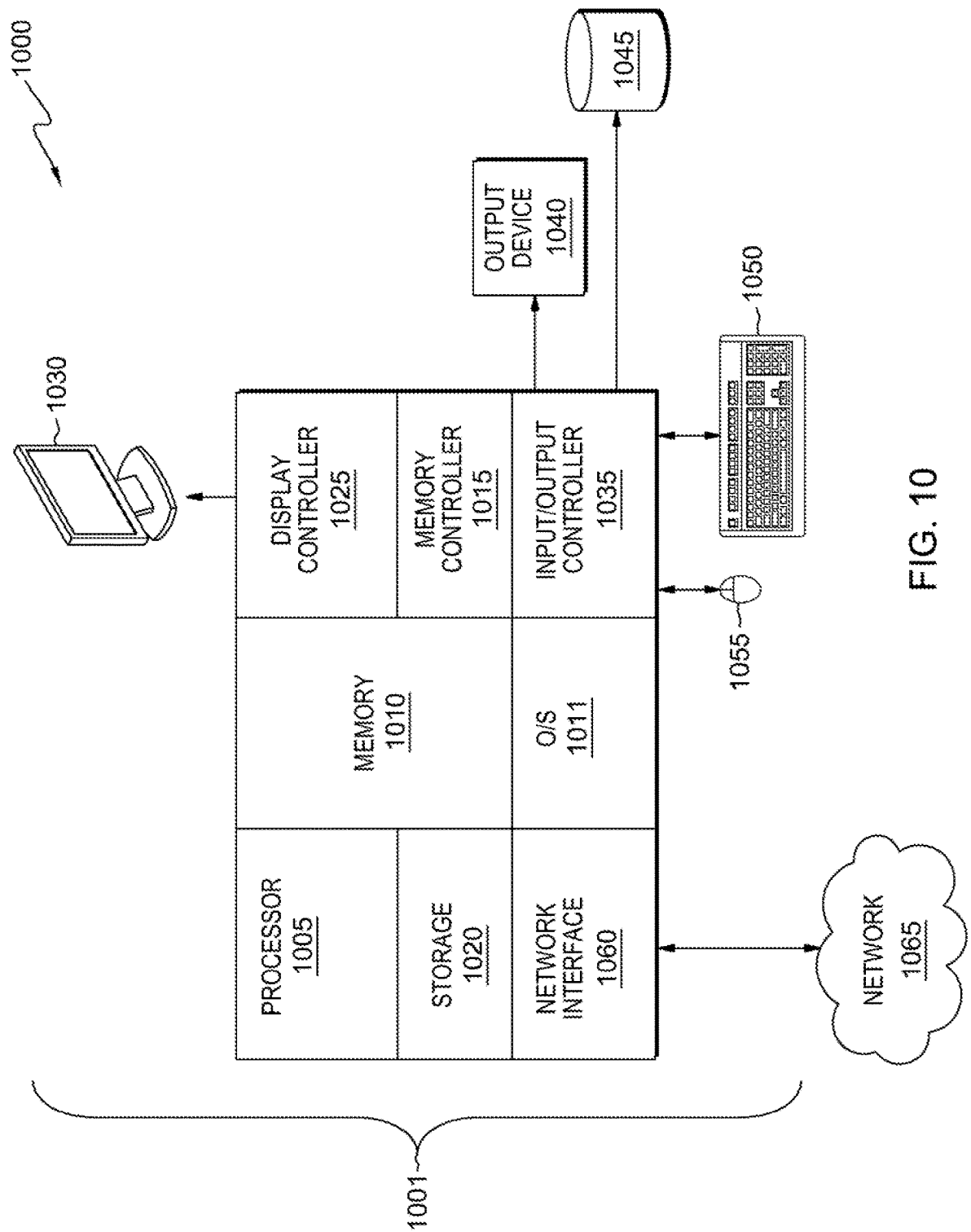
FIG. 10 illustrates a computer system for image processing in accordance with an embodiment of the present invention.

FIG. 10 illustrates a computer system for media file processing and enhancement in accordance with one or more embodiments of the present invention.

Turning now to FIG. 10, a computer system for image processing and enhancement, such as the media file processing device 102 in FIG. 1, is generally shown in accordance with one or more embodiments of the present invention. The methods described herein can be implemented in hardware, software (e.g., firmware), or a combination thereof. In one or more exemplary embodiments of the present invention, the methods described herein are implemented in hardware as part of the microprocessor of a special or general-purpose digital computer, such as a personal computer, workstation, minicomputer, or mainframe computer. The system 1000 therefore may include general-purpose computer or mainframe 1001 capable of running multiple instances of an 0/S simultaneously.

In one or more exemplary embodiments of the present invention, in terms of hardware architecture, as shown in FIG. 10, the computer 1001 includes one or more processors 1005, memory 1010 coupled to a memory controller 1015, and one or more input and/or output (I/O) devices 1040, 1045 (or peripherals) that are communicatively coupled via a local input/output controller 1035. The input/output controller 1035 can be, for example but not limited to, one or more buses or other wired or wireless connections, as is known in the art. The input/output controller 1035 may have additional elements, which are omitted for simplicity, such as controllers, buffers (caches), drivers, repeaters, and receivers, to enable communications. Further, the local interface may include address, control, and/or data connections to enable appropriate communications among the aforementioned components. The input/output controller 1035 may include a plurality of sub-channels configured to access the output devices 1040 and 1045. The sub-channels may include fiber-optic communications ports.

The processor 1005 is a hardware device for executing software, particularly that stored in storage 1020, such as cache storage, or memory 1010. The processor 1005 can be any custom made or commercially available processor, a central processing unit (CPU), an auxiliary processor among several processors associated with the computer 1001, a semiconductor based microprocessor (in the form of a microchip or chip set), a macroprocessor, or generally any device for executing instructions.

The memory 1010 can include any one or combination of volatile memory elements (e.g., random access memory (RAM, such as DRAM, SRAM, SDRAM, etc.)) and non-volatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 1010 may incorporate electronic, magnetic, optical, and/or other types of storage media. Note that the memory 1010 can have a distributed architecture, where various components are situated remote from one another, but can be accessed by the processor 1005.

The instructions in memory 1010 may include one or more separate programs, each of which comprises an ordered listing of executable instructions for implementing logical functions. In the example of FIG. 10, the instructions in the memory 1010 a suitable operating system (OS) 1011. The operating system 1011 essentially controls the execution of other computer programs and provides scheduling, input-output control, file and data management, memory management, and communication control and related services.

In accordance with one or more embodiments of the present invention, the memory 1010 may include multiple logical partitions (LPARs) each running an instance of an operating system. The LPARs may be managed by a hypervisor, which may be a program stored in memory 1010 and executed by the processor 1005.

In one or more exemplary embodiments of the present invention, a conventional keyboard 1050 and mouse 1055 can be coupled to the input/output controller 1035. Other output devices such as the I/O devices 1040, 1045 may include input devices, for example but not limited to a printer, a scanner, microphone, and the like. Finally, the I/O devices 1040, 1045 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The system 1000 can further include a display controller 1025 coupled to a display 1030.

In one or more exemplary embodiments of the present invention, the system 1000 can further include a network interface 1060 for coupling to a network 1065. The network 1065 can be an IP-based network for communication between the computer 1001 and any external server, client and the like via a broadband connection. The network 1065 transmits and receives data between the computer 1001 and external systems, such as the external processing device 108 of FIG. 1. In an exemplary embodiment, network 1065 can be a managed IP network administered by a service provider. The network 1065 may be implemented in a wireless fashion, e.g., using wireless protocols and technologies, such as WiFi, WiMax, etc. The network 1065 can also be a packet-switched network such as a local area network, wide area network, metropolitan area network, Internet network, or other similar type of network environment. The network 1065 may be a fixed wireless network, a wireless local area network (LAN), a wireless wide area network (WAN) a personal area network (PAN), a virtual private network (VPN), Intranet or other suitable network system and includes equipment for receiving and transmitting signal.

If the computer 1001 is a PC, workstation, intelligent device or the like, the instructions in the memory 1010 may further include a basic input output system (BIOS) (omitted for simplicity). The BIOS is a set of essential software routines that initialize and test hardware at startup, start the OS 1011, and support the transfer of data among the hardware devices. The BIOS is stored in ROM so that the BIOS can be executed when the computer 1001 is activated.

When the computer 1001 is in operation, the processor 1005 is configured to execute instructions stored within the memory 1010, to communicate data to and from the memory 1010, and to generally control operations of the computer 1001 pursuant to the instructions.

Embodiments of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The present invention may be a system, a method, and/or a computer program product. The computer program product may include a computer readable storage medium (or media) having computer readable program instructions thereon for causing a processor to carry out embodiments of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CDROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform embodiments of the present invention.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement embodiments of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e., one, two, three, four, etc. The terms "a plurality" may be understood to include any integer number greater than or equal to two, i.e., two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention will be presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for determining a toning coefficient of a media file, wherein the media file comprises at least a video file and a video sound file, the method comprising:

receiving, by a processor, the media file comprising a plurality of frames, wherein each of the plurality of frames comprises an image having a plurality of pixels and a sound sample;

determining, by the processor, an image toning coefficient for each of the plurality of frames, wherein the image toning coefficient is determined using a LAB color space model having a first characteristic, a second characteristic and a third characteristic and wherein the first characteristic comprises L characteristic, the second characteristic comprises A characteristic and the third characteristic comprises B characteristic, wherein the L characteristic is an array of 101 elements, and the A and B characteristics have values in the form of negative deviation from 0 in respective directions, by:

determining toning characteristic function for the received image, wherein determining the toning characteristic function comprises identifying, by the processor, the first characteristic, the second characteristic and the third characteristic as the one or more characteristic functions for analyzing the received image, and wherein determining the toning characteristic function for each pixel of the plurality of pixels comprises determining the toning characteristic based on a sum of the second characteristic value and the third characteristic value for the a corresponding pixel and based on a deviation of the first characteristic value for the corresponding pixel from an average first characteristic value;

analyzing distribution of the plurality of pixels of the received image using the toning characteristic functions; and determining the toning coefficient of the received image based on the analyzed distribution of the plurality of pixels;

determining, by the processor, a sound toning coefficient for the media file by:

analyzing distribution of the plurality of samples corresponding to the plurality of frames of the video sound file using sound characteristic functions; and determining the sound toning coefficient of the video sound file based on the analyzed distribution of the plurality of samples; and determining, by the processor, the coefficient of toning of the media file based on a ratio of an average of the determined image toning coefficient and the determined sound toning coefficient.

2. The method of claim 1, wherein the image toning coefficient comprises an average value of a plurality of image toning coefficients calculated for each of the plurality of frames.

3. The method of claim 1, wherein the deviation of the first characteristic value is an integer value ranging between 0 and 50.

4. The method of claim 1, wherein the deviation of the first characteristic value is adjusted using a correction coefficient value, and wherein the correction coefficient value depends on the sum of the first characteristic value and the second characteristic value.

5. The method of claim 1, further comprising adjusting, by the processor, the determined image toning coefficient of the received image using a peripherality correction coefficient.

6. The method of claim 1, wherein the sound characteristic functions comprise a sound frequency characteristic and a sound amplitude characteristic.

7. The method of claim 6, wherein determining the sound toning coefficient comprises dividing, by the processor, the video sound file into a plurality of segments.

8. The method of claim 7, wherein each of the plurality of segments represents a decisecond.

9. The method of claim 8, wherein analyzing the distribution of the plurality of samples of the video sound file using the selected characteristic functions comprises calculating, by the processor, an average value of the sound amplitude characteristic for each of the plurality of samples.

10. The method of claim 9, wherein determining the sound toning coefficient comprises comparing, by the processor, the average value of the sound amplitude characteristic for each pair of adjacent samples of the plurality of samples.

11. The method of claim 10, wherein determining the sound toning coefficient comprises determining, by the processor, a coefficient of change value based on the comparing the average value of the sound amplitude characteristic for the plurality of adjacent samples of the plurality of samples and removing samples having the value of the coefficient of change less than a threshold from a subsequent analysis.

12. The method of claim 11, wherein the sound toning coefficient is determined based on a difference in deciseconds between neighboring samples.

\* \* \* \* \*